United States Patent

Bell et al.

[11] Patent Number: 5,823,818
[45] Date of Patent: Oct. 20, 1998

[54] TEST PROBE FOR COMPUTER CIRCUIT BOARD TEST FIXTURE

[75] Inventors: James S. Bell, Cedar Park; Franklin D. Tomlinson, Round Rock, both of Tex.

[73] Assignee: Dell U.S.A., L.P., Round Rock, Tex.

[21] Appl. No.: 781,377

[22] Filed: Jan. 21, 1997

[51] Int. Cl.$^6$ .................................................. G01R 1/073
[52] U.S. Cl. .......................................... 439/482; 324/761
[58] Field of Search ................................. 439/140, 141, 439/482; 324/757, 761

[56] References Cited

U.S. PATENT DOCUMENTS

| 2,567,727 | 9/1951 | Quackenbush | 439/141 |
|---|---|---|---|
| 5,442,299 | 8/1995 | Caggiano | 324/761 |
| 5,485,096 | 1/1996 | Aksu | 324/761 |
| 5,493,230 | 2/1996 | Swart et al. | 324/761 |
| 5,506,510 | 4/1996 | Blumenau | 324/761 |

FOREIGN PATENT DOCUMENTS

| 2-234066 | 9/1990 | Japan | 324/761 |
|---|---|---|---|
| 6-317607 | 11/1994 | Japan | 324/761 |

*Primary Examiner*—Neil Abrams
*Attorney, Agent, or Firm*—Haynes and Boone, L.L.P.

[57] ABSTRACT

An improved test probe for use with a bed of nails type test fixture is disclosed. The test probe comprises a probe body having a test head at one end for contacting test points on a DUT placed in a test fixture and an annular ring disposed around the circumference thereof proximate the center of the probe. A nonconductive tubular sheath is disposed over the test head and affixed at one end to the test probe by the annular ring. The other end of the sheath extends beyond the test head such that the test head is recessed within the sheath a distance defined by component lead length and PCB thickness fault tolerances and acceptable float. In this manner, the test probe enables the detection of PCB faults caused by missing or improperly or incorrectly inserted plated through-hole mounted components.

25 Claims, 1 Drawing Sheet

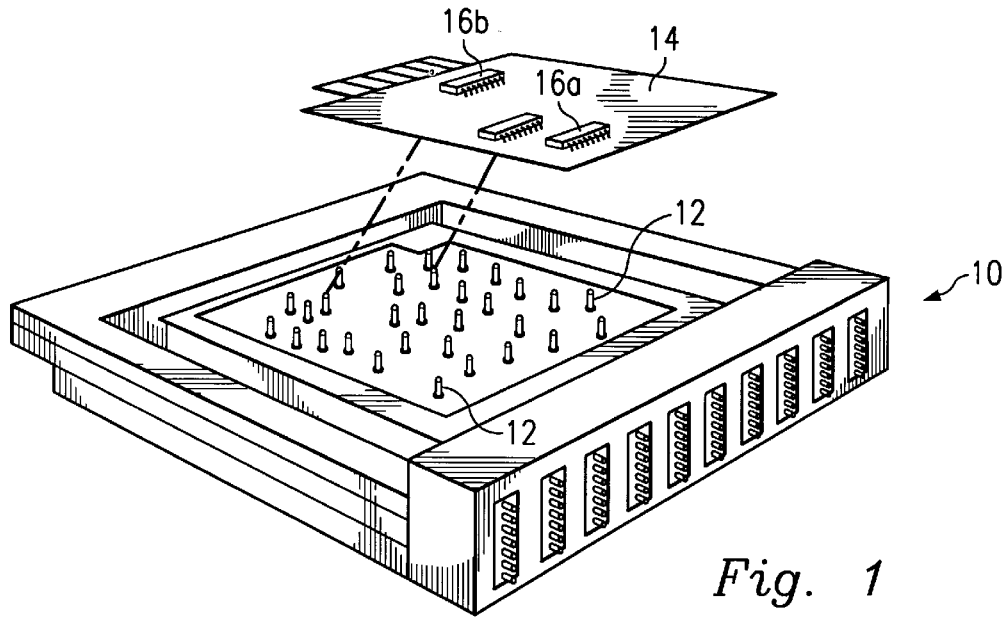
Fig. 1
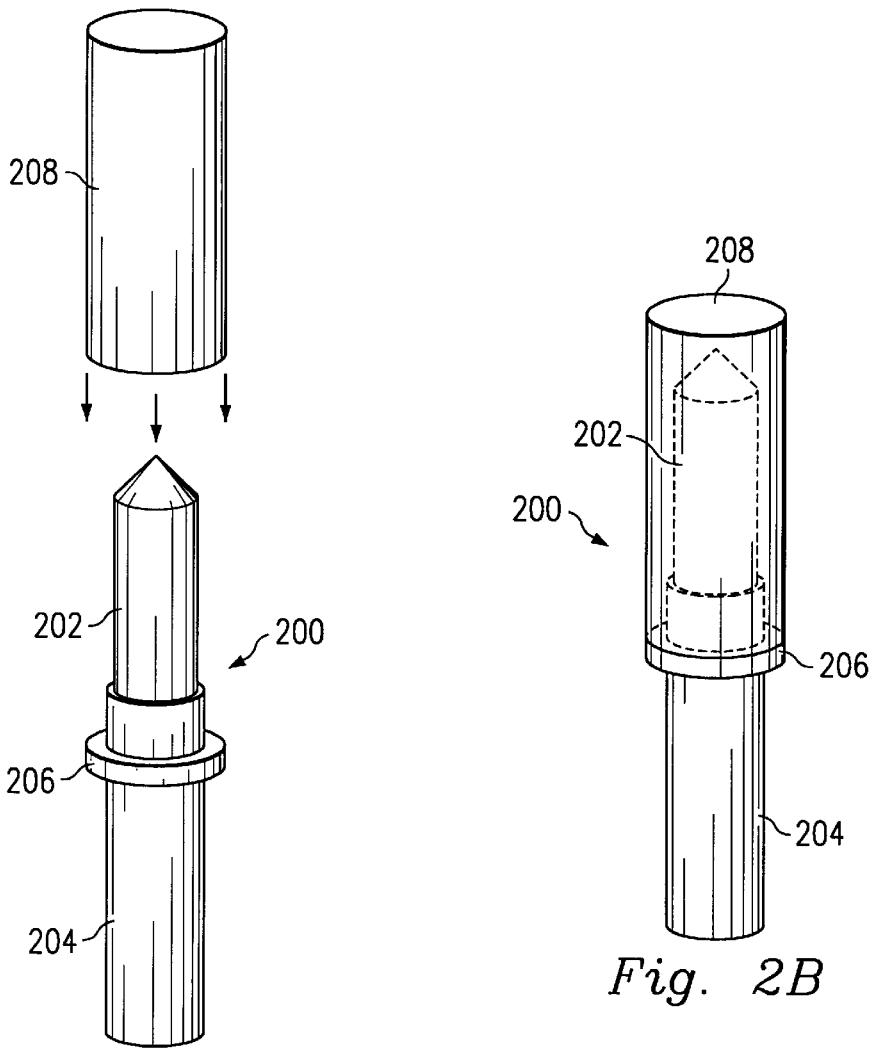
Fig. 2A
Fig. 2B

TEST PROBE FOR COMPUTER CIRCUIT BOARD TEST FIXTURE

TECHNICAL FIELD

In one embodiment, the invention relates generally to equipment for testing computer printed circuit boards and, more particularly, to an improved test probe for use in a "bed of nails" type printed circuit board test fixture.

BACKGROUND

The assembly and population of a printed circuit board ("PCB") involves numerous process steps, making testing and inspection of the PCB at various stages throughout the process vital to the economical fabrication of a high quality product. This is especially true as increased integrated circuit (I/C) chip densities and advances in surface mount technology increase PCB loadings. PCB faults may originate from component IC chips and/or bare boards themselves or from incorrect placement and/or soldering of chips to the board. Such faults may include, for example, nonoptimal or incorrect circuit performance, open circuits, short circuits, and out of tolerance faults.

Improper mounting of a plated through-hole mounted component can result from the pins thereof not being fully inserted into the corresponding through-holes, as well as from certain ones of the pins being inserted further than others, such that the component is tilted. Additional faults may occur during wave soldering. In particular, in wave soldered plated through-hole mounted components, a well soldered joint is characterized by solder fillet having a meniscus that substantially covers the copper land and the plated through-hole and extends from the PCB a predetermined distance. Problems can arise when there is a shortage or an excess of solder at the solder joint.

Automatic test equipment for verifying the electrical continuity of circuits embodied in printed circuit boards ("PCBs") often employ a "bed of nails" type test fixture, to which the PCB being tested (the "device under test" or "DUT") is mounted during testing. A bed of nails test fixture includes a plurality of spring-loaded test probes arranged to make electrical contact under spring pressure with designated test points on the DUT. Because the configuration of a particular circuit laid out on a DUT will differ from that of other circuits, the bed of nails arrangement for contacting test points on the DUT must be customized for the circuit embodied therein. Accordingly, when the circuit to be tested is designed, a pattern of test points to be used in checking it is selected, and a corresponding array of test probes is configured in the test fixture. This typically involves drilling a pattern of holes in a probe plate to match the customized array of test probes and then mounting the test probes in the drilled holes on the probe plate. The DUT is then mounted in the fixture superimposed on the array of test probes. During testing, the spring-loaded probes are brought into spring-pressure contact with the test points on the DUT. Electrical test signals are then applied to the test points on the DUT via the test probes and then to the exterior of the fixture for communication with a high speed electronic test analyzer that detects continuity or lack of continuity between various test points in the circuits on the DUT. During testing, the DUT is brought into contact with the test probes by a vacuum applied to the interior of the test fixture housing or other mechanical means capable of applying the spring force necessary for compressing the DUT into contact with the probes during testing.

One problem commonly encountered in connection with wave soldered plated through-hole mounted components, as previously mentioned, is that sometimes one or more through-hole pins of a component will be missing or not fully inserted into the through-hole. In such cases, it would not be uncommon for the test probe to contact with all the electrical nodes of a through-hole device and test "OK," even though the component may be missing or installed on the PCB incorrectly. For example, the component may be tilted or "floated" in the wave solder process assembly phase of the PCB production. Normal test probes will connect to the PCB land pattern and, in many cases, will test "OK," resulting in a potential failure at the system assembly level, where an electrical connection to the particular component either does not exist or an improperly mounted connector will not allow for submodules to properly interface with the errant connector in a mechanical tolerance stack up sense.

Presently, the only manner in which such faults can be detected is through a visual inspection of each PCB. While some such faults can be detected in this manner, because many faults are defined in terms of hundredths of an inch, it is often difficult, if not impossible, to detect such faults visually.

Therefore, what is needed is an improved bed of nails type test probe for detecting PCB faults caused by missing or improperly or incorrectly inserted plated through-hole mounted components.

SUMMARY

One embodiment provides an improved test probe for use with a bed of nails type test fixture. A test probe includes a probe body having a test head at one end for contacting test points on a DUT placed in a test fixture and an annular ring disposed around the circumference thereof proximate the center of the probe. A nonconductive tubular sheath is disposed over the test head and affixed at one end to the test probe by the annular ring. The other end of the sheath extends beyond the test head such that the test head is recessed within the sheath a distance defined by component lead length and PCB thickness fault tolerances and acceptable float.

A technical advantage is that it prevents DUTs having missing or improperly inserted components from testing "OK."

Another technical advantage is that it prevents the test head from contacting a corresponding test point on a DUT unless a solder fillet extends a predefined distance from the underside of the DUT.

BRIEF DESCRIPTION OF THE DRAWINGS

FIG. 1 is a perspective view of a bed of nails type of PCB test fixture.

FIG. 2A is an exploded view of a test probe embodying features of one embodiment of the present invention for use in connection with the fixture of FIG. 1.

FIG. 2B is a cutaway view of the test probe of FIG. 2A.

DESCRIPTION OF THE PREFERRED EMBODIMENT

FIG. 1 illustrates an exemplary bed of nails type test fixture 10 in connection with which the improved test probe may be used. The test fixture 10 is conventional in all respects and includes a plurality of test probes 12 for contacting with test points (not shown) on a PCB 14 under test. As previously indicated, during testing, the PCB 14 will be brought into spring-loaded contact with the test probes 12 via mechanical means (not shown) such as a vacuum or clamps, for example. It will also be recognized that the fixture 10 will be electrically connected to an appropriate test analyzer (not shown) for analyzing the results of tests performed on the PCB 14. Because the operation and configuration of test fixtures such as the fixture 10 are well known in the art, the fixture 10 will not be described in further detail except as necessary to impart a complete understanding of the embodiments of the present invention described herein.

As shown in FIG. 1, the PCB 14 includes a plurality of through-hole mounted components, such as an IC chip 16a and a connector 16b. In one embodiment, the connector 16b may be for connecting a riser card (not shown) having additional connectors thereon to the PCB 14, thereby enabling the connection of a plurality of option cards (not shown) to the PCB 14. It will be recognized that if the connector 16b is missing, the PCB 14 will likely test OK electrically, but will obviously be faulty. Moreover, if the connector 16b is tilted in some fashion, the riser card and associated option cards may be prevented from being installed.

Referring now to FIGS. 2A and 2B, a test probe embodying features of one embodiment of the present invention is designated by a reference numeral 200. As shown in FIGS. 2A and 2B, the test probe 200 includes a test head 202 and a probe body 204 disposed in spring loaded connection with one another in a conventional manner via a spring 205. In a preferred embodiment, an annular ring 206 is disposed about the circumference of the probe body 204 and is preferably integral with the probe body.

A nonconductive tubular sheath 208 is disposed over the test head 202 and removably affixed to the probe body 204 via the ring 206 by disposing one end of the sheath 208 over the ring 206. Accordingly, it will be apparent that the circumference of the sheath 208 must be sufficient to enable the sheath to be slipped over the ring 206, but small enough to retain the sheath in place once thus disposed without the application of force thereto. Clearly, the sheath 208 must be fabricated from sufficiently resilient nonconductive material, such as ceramic, plastic, Teflon or wood, to enable it to withstand repeated use.

In addition, the sheath 208 is of sufficient length such that once affixed to the test probe 200 in the manner described above, it extends beyond the end of the test head 202 a distance D, which is defined by the minimum tolerance of the lead length of the component, the maximum tolerance of the PCB thickness, and the maximum amount of acceptable "float" between the component and the PCB. Accordingly, D is calculated so that the shortest acceptable amount of lead protruding through the PCB 14 will be contacted by the test head 202. For example, assuming that to be "in spec" the leads of the connector 16a must be 0.090"+/−0.005", the thickness of the PCB 14 must be 0.062"+/−0.007", and the maximum acceptable float between the two is 0.010", the shortest in-spec lead would be 0.085", the thickest in-spec PCB would be 0.069, and D would be equal to the shortest in-spec lead less the thickest in-spec PCB less the maximum acceptable float, or 0.006". Thus, unless a fillet 210 on a lead 212 at a particular test point to be connected by the probe 200 extends at least 0.006" from the surface of the PCB 14, the test head 202 will be prevented by the sheath 208 from contacting the test point and the PCB will fail. This situation is illustrated in FIG. 2B.

It will be recognized that any number of mechanical means for removably affixing the sheath 208 to the probe 200 may be used in place of the ring 206. One example of such a replacement might be two small nubs disposed on opposite sides of the probe body.

Although an illustrative embodiment of the invention has been shown and described, other modifications, changes, and substitutions are intended in the foregoing disclosure. Accordingly, it is appropriate that the appended claims be construed broadly and in a manner consistent with the scope of the invention.

What is claimed is:

1. A bed of nails type test fixture for ensuring that a printed circuit board ("PCB") will fail unless a fillet at a test point extends at least a predetermined distance beyond a surface of said PCB, the test fixture including a plurality of test probes, each of said test probes comprising a test head disposed at one end of said test probe and a probe body comprising the remainder of said test probe, a tubular sheath, and means for securing said tubular sheath to said probe body such that said tubular sheath is disposed around said test head and is immobile with respect to said probe body, and said test head is recessed within said tubular sheath said predetermined distance.

2. The test fixture of claim 1 wherein, at a test point at which a printed circuit board ("PCB") component having a minimum lead length tolerance is to be connected to a PCB having a maximum thickness tolerance, said predetermined distance is defined by subtracting said maximum thickness tolerance and an acceptable amount of float from said minimum lead length tolerance.

3. The test fixture of claim 1 wherein said means for securing is an annular ring.

4. The test fixture of claim 1 wherein said test probe is a spring-loaded test probe.

5. A test probe for use in a bed of nails type test fixture for ensuring that a printed circuit board ("PCB") will fail unless, a fillet at a test point extends at least a predetermined distance beyond a surface of said PCB, the test probe comprising:

a test head disposed at one end of said test probe;

a probe body comprising the remainder of said test probe;

a tubular sheath; and means for securing said tubular sheath to said probe body such that said tubular sheath is disposed around said test head and is immobile with respect to said probe body and said test head is recessed within said tubular sheath a predetermined distance.

6. The test probe of claim 5 wherein, at a test point at which a printed circuit board ("PCB") component having a minimum lead length tolerance is to be connected to a PCB having a maximum thickness tolerance, said predetermined distance is defined by subtracting said maximum thickness tolerance and an acceptable amount of float from said minimum lead length tolerance.

7. The test probe of claim 5 wherein said tubular sheath is fabricated from a nonconductive material.

8. The test probe of claim 7 wherein said tubular sheath is fabricated from a material selected from the group consisting of ceramic, plastic, Teflon and wood.

9. The test probe of claim 5 means for securing is an annular ring.

10. The test probe of claim 5 wherein said test probe is a spring-loaded test probe.

11. A test probe for use in a bed of nails type test fixture for ensuring that a printed circuit board ("PCB") will fail unless, a fillet at a test point extends at least a predetermined distance beyond a surface of said PCB, the test probe comprising:

a test head disposed at one end of said test probe;

an annular ring disposed around a circumference of said test probe between said test head and a second end of said test probe; and a tubular sheath disposed over said first end of said test probe and secured to said test probe via said annular ring such that said test head is recessed within said tubular sheath a predetermined distance and said tubular sheath is immobile with respect to said second end of said test probe.

12. The test probe of claim 11 wherein, at a test point at which a printed circuit board ("PCB") component having a minimum lead length tolerance is to be connected to a PCB having a maximum thickness tolerance, said predetermined distance is defined by subtracting said maximum thickness tolerance and an acceptable amount of float from said minimum lead length tolerance.

13. The test probe of claim 11 wherein said tubular sheath is fabricated from a nonconductive material.

14. The test probe of claim 13 wherein said tubular sheath is fabricated from a material selected from the group consisting of ceramic, plastic, Teflon and wood.

15. The test probe of claim 11 wherein said tubular sheath is removably connected to said annular ring.

16. The test probe of claim 11 wherein said test probe is a spring-loaded test probe.

17. A test probe assembly for a bed of nails type test fixture for ensuring that a printed circuit board ("PCB") will fail unless, a fillet at a test point extends at least a predetermined distance beyond a surface of said PCB, the assembly comprising:

a test probe body having distal ends;

a test head connected to one end of said test probe body;

a tubular sheath; and means for securing said tubular sheath to said test probe body such that said tubular sheath surrounds said test head and is immobile with respect to said test probe body and said test head is recessed within said tubular sheath a predetermined distance.

18. The assembly of claim 17 wherein said connection between said test head and said probe body is a spring-loaded connection.

19. The assembly of claim 17, wherein at a test point at which a printed circuit board ("PCB") component having a minimum lead length tolerance is to be connected to a PCB having a maximum thickness tolerance, said predetermined distance is defined by subtracting said maximum thickness tolerance and an acceptable amount of float from said minimum lead length tolerance.

20. The assembly of claim 17 wherein said tubular sheath is fabricated from a nonconductive material.

21. The assembly of claim 20 wherein said tubular sheath is fabricated from a material selected from the group consisting of ceramic, plastic, Teflon and wood.

22. The assembly of claim 17 wherein said means for securing comprises an annular ring having a circumference slightly smaller than a circumference of said tubular sheath.

23. A method of using a bed of nails type test fixture to test electrical connections of a printed circuit board ("PCB") for ensuring that the PCB will fail unless, a fillet at a test point extends at least a predetermined distance beyond a surface of said PCB, the method comprising:

providing said test fixture with a plurality of test probes, each of said test probes comprising a tubular sheath disposed around a test head of said test probe and immovably secured to a probe body of said test probe such that said test head is recessed within said tubular sheath a predetermined distance; and placing said PCB on said test fixture such that test points of said test fixture are aligned with corresponding ones of said test probes.

24. the method of claim 23 wherein, at one of said test point at which a PCB component having a minimum lead length tolerance is to be connected to a PCB having a maximum thickness tolerance, said predetermined distance is defined by subtracting said maximum thickness tolerance and an acceptable amount of float from said minimum lead length tolerance.

25. The method of claim 23 wherein said test probe is a spring-loaded test probe.

\* \* \* \* \*